(12) United States Patent
Sekimoto et al.

(10) Patent No.: US 10,090,268 B2
(45) Date of Patent: Oct. 2, 2018

(54) METHOD OF FORMING SOLDER BUMP, AND SOLDER BUMP

(71) Applicants: Murata Manufacturing Co., Ltd., Nagaokakyo-shi, Kyoto-fu (JP); Senju Metal Industry Co., Ltd., Adachi-ku, Tokyo (JP)

(72) Inventors: Yasuyuki Sekimoto, Nagaokakyo (JP); Hidekiyo Takaoka, Nagaokakyo (JP); Shigeo Nishimura, Nagaokakyo (JP); Minoru Ueshima, Matsudo (JP); Tohru Kurushima, Tokyo (JP)

(73) Assignees: MURATA MANUFACTURING CO., LTD., Nagaokakyo-Shi, Kyoto-Fu (JP); SENJU METAL INDUSTRY CO., LTD., Adachi-Ku, Tokyo (JP)

( * ) Notice: Subject to any disclaimer, the term of this patent is extended or adjusted under 35 U.S.C. 154(b) by 499 days.

(21) Appl. No.: 14/809,533

(22) Filed: Jul. 27, 2015

(65) Prior Publication Data

US 2015/0333027 A1    Nov. 19, 2015

Related U.S. Application Data

(63) Continuation of application No. PCT/JP2014/051358, filed on Jan. 23, 2014.

(30) Foreign Application Priority Data

Jan. 28, 2013  (JP) ................................. 2013-012882

(51) Int. Cl.
*H01L 21/58* (2006.01)
*H01L 23/00* (2006.01)
(Continued)

(52) U.S. Cl.
CPC .......... *H01L 24/13* (2013.01); *B23K 35/0244* (2013.01); *B23K 35/0261* (2013.01);
(Continued)

(58) Field of Classification Search
CPC ......... H01L 24/13; H01L 24/11; H01L 24/16; H01L 21/48; H01L 2224/0401;
(Continued)

(56) References Cited

U.S. PATENT DOCUMENTS 8,227,536 B2 * 7/2012 Watanabe ............. B22F 1/0059
                                                              148/24
9,305,875 B2 * 4/2016 Shimizu .................. H01L 24/05
(Continued)

FOREIGN PATENT DOCUMENTS

JP    H10-41621 A    2/1998
JP    H11-33775 A    2/1999
(Continued)

OTHER PUBLICATIONS

International Search Report issued for PCT/JP2014/051358, dated Mar. 11, 2014.
(Continued)

*Primary Examiner* — C Melissa Koslow
(74) *Attorney, Agent, or Firm* — Arent Fox LLP

(57) ABSTRACT

A solder bump formed on an Ni electrode with the use of a solder ball containing Bi as a main component and Sn as a sub component. The solder ball contains Sn from 1.0 to 10.0 mass % and at most 1.0 mass % of at least one of Cu and Ag. A solder joint portion obtained by use of the solder bump has at least one of Sn and an SnBi eutectic alloy.

16 Claims, 7 Drawing Sheets

(51) Int. Cl.
*B23K 35/02* (2006.01)
*B23K 35/26* (2006.01)
*C22C 12/00* (2006.01)
*H05K 3/34* (2006.01)
*B23K 35/30* (2006.01)
*H01L 21/48* (2006.01)
*H01L 21/50* (2006.01)

(52) U.S. Cl.
CPC ........ *B23K 35/264* (2013.01); *B23K 35/3033* (2013.01); *C22C 12/00* (2013.01); *H01L 21/48* (2013.01); *H01L 21/50* (2013.01); *H01L 24/11* (2013.01); *H01L 24/16* (2013.01); *H01L 24/81* (2013.01); *H05K 3/3436* (2013.01); *H05K 3/3463* (2013.01); *H01L 2224/0401* (2013.01); *H01L 2224/05005* (2013.01); *H01L 2224/05023* (2013.01); *H01L 2224/05082* (2013.01); *H01L 2224/05155* (2013.01); *H01L 2224/05541* (2013.01); *H01L 2224/05568* (2013.01); *H01L 2224/05644* (2013.01); *H01L 2224/08503* (2013.01); *H01L 2224/11334* (2013.01); *H01L 2224/11849* (2013.01); *H01L 2224/13006* (2013.01); *H01L 2224/13014* (2013.01); *H01L 2224/13016* (2013.01); *H01L 2224/13113* (2013.01); *H01L 2224/16013* (2013.01); *H01L 2224/16238* (2013.01); *H01L 2224/16503* (2013.01); *H01L 2224/81024* (2013.01); *H01L 2224/8191* (2013.01); *H01L 2224/81191* (2013.01); *H01L 2224/81444* (2013.01); *H01L 2224/81815* (2013.01); *H01L 2224/83104* (2013.01); *H01L 2224/83855* (2013.01); *H01L 2924/014* (2013.01); *H01L 2924/0105* (2013.01); *H01L 2924/01028* (2013.01); *H01L 2924/01029* (2013.01); *H01L 2924/01047* (2013.01); *H01L 2924/01322* (2013.01); *H01L 2924/3841* (2013.01); *H05K 2201/10674* (2013.01); *Y02P 70/613* (2015.11)

(58) Field of Classification Search
CPC . H01L 2224/05113; H01L 2224/05613; H01L 2224/11334; H01L 2224/13014; H01L 2224/13113; H05K 3/3436; H05K 3/3434; B23K 35/0244; B23K 35/264; C22C 12/00
See application file for complete search history.

(56) References Cited

U.S. PATENT DOCUMENTS

2009/0301697 A1* 12/2009 Hirose ................. H01L 23/373
165/148
2011/0220398 A1* 9/2011 Sakuyama .......... H01L 21/4853
174/257

FOREIGN PATENT DOCUMENTS

| JP | 11-330678 | * | 11/1999 |
| JP | H11-330678 A | | 11/1999 |
| JP | 2007-251053 A | | 9/2007 |
| JP | 2010-129664 A | | 6/2010 |
| JP | 2011-238720 A | | 11/2011 |
| WO | WO 2010/061428 A1 | | 6/2010 |

OTHER PUBLICATIONS

Written Opinion of the International Searching Authority issued for PCT/JP2014/051358, dated Mar. 11, 2014.

* cited by examiner

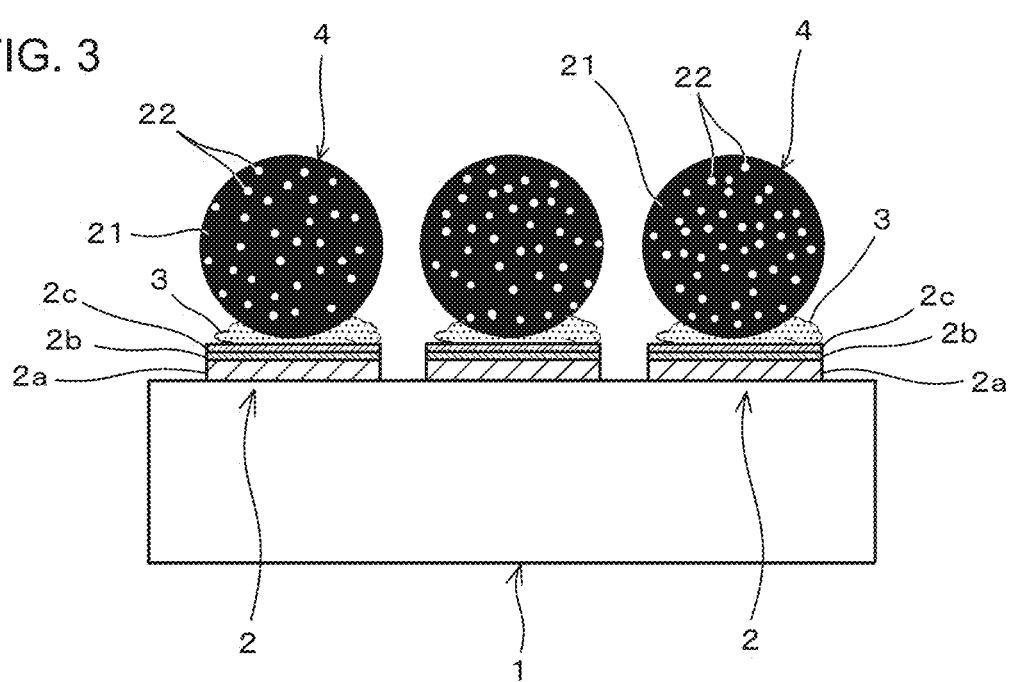

METHOD OF FORMING SOLDER BUMP, AND SOLDER BUMP

CROSS REFERENCE TO RELATED APPLICATIONS

The present application is a continuation of International application No. PCT/JP2014/051358, filed Jan. 23, 2014, which claims priority to Japanese Patent Application No. 2013-012882, filed Jan. 28, 2013, the entire contents of each of which are incorporated herein by reference.

FIELD OF THE INVENTION

The present invention relates to a method of forming a solder bump and to a solder bump, and specifically to a method of forming a solder bump which can be applied to BGA mounting of an IC chip or the like and to a solder bump formed with the forming method.

BACKGROUND OF THE INVENTION

Solder has widely been used as a conductive joint material used for mounting an electronic component.

Sn—Pb-based solder has conventionally generally been employed as solder. Recently, however, instead of the Sn—Pb-based solder, what is called Pb-free solder not containing Pb has widely been used.

PTD 1 discloses an electronic device including such solder not containing Pb and a method of manufacturing the same.

This PTD 1 describes a method of manufacturing an electronic device, including the step of forming a solder bump on a semiconductor chip with the use of a solder joint material containing (a) a first metal containing at least Bi, (b) an alloy of a second metal and a third metal, and (c) a third metal, the second metal being capable of making an intermetallic compound with Ni.

When a solder bump is formed with the solder joint material as in PTD 1, however, Ni and Bi react with each other because Ni or an Ni—P alloy is used in a barrier metal layer and hence a needle-shaped crystal is formed on a surface of the solder bump. Therefore, the surface of the solder bump does not have gloss and it is difficult to inspect a state of formation of a solder bump with such an optical method as a method with the use of an image sensor. In addition, when soldering is carried out with the use of a solder bump having a needle-shaped crystal formed on a surface, soldering high in reliability cannot be achieved.

PTD 2 discloses an electronic component (or a substrate) as an electronic component (or a substrate) to be joined to a substrate with the use of a Bi-based solder alloy not containing Pb but containing 80 mass % or more of Bi, in which a Zn metallized layer having a thickness from 0.05 to 8.00 μm or an Sn metallized layer having a thickness from 0.05 to 3.00 μm is formed on an Ni-containing layer which is an uppermost layer of the electronic component (or the substrate), and further discloses an electronic component (or a substrate) in which a second metallized layer having a thickness from 0.05 to 1.00 μm and selected from among Ag, Au, and Cu is formed on the Zn metallized layer or the Sn metallized layer.

In PTD 2, however, even though the Zn metallized layer or the Sn metallized layer is formed on the Ni-containing layer of the electronic component (or the substrate), for solder joint, solder joint should be carried out by separately externally supplying a Bi-based solder alloy containing 80 mass % or more of Bi, and application to a method of forming a solder bump on an electrode and carrying out solder joint with this solder bump itself (without externally supplying a solder joint material) cannot be made as in BGA mounting.

PTD 1: Japanese Patent Laying-Open No. 2010-129664
PTD 2: Japanese Patent Laying-Open No. 2011-238720

SUMMARY OF THE INVENTION

The present invention solves the problems above, and an object thereof is to provide a solder bump which has a smooth and glossy surface and can be subjected to appearance inspection with such an optical method as a method with the use of an image sensor, soldering with which can achieve highly reliable solder joint, and a method of forming the same.

In order to solve the problems above, a method of forming a solder bump according to the present invention is a method of forming a solder bump on an electrode, and includes forming a solder bump on an electrode containing Ni, with the use of a solder ball containing Bi as a main component and Sn as a sub component.

The method of forming a solder bump according to the present invention is premised on the fact that the solder ball contains 80.0 mass % or more of Bi. The solder ball contains preferably 90.0 mass % or more and further preferably 95.0 mass % or more of Bi.

In the method of forming a solder bump according to the present invention, the solder ball preferably contains Sn in a range from 1.0 to 10.0 mass % and further preferably contains Sn in a range from 1.0 to 2.0 mass %.

When Sn in a range from 1.0 to 10.0 mass % is contained, a solder bump which has high shape accuracy and a smooth and glossy surface, can be subjected to appearance inspection with such an optical method as a method with the use of an image sensor, and can achieve highly reliable soldering can more reliably be formed.

In addition, resistance to solder flash can be improved.

Here, "solder flash" refers to such a phenomenon that, when heating again to a melting temperature of a solder material is carried out after a component is mounted on a substrate with the use of solder and sealing with a resin material such as an underfill is carried out, the solder material progresses while it breaks an interface between the resin and the component or an interface between the resin and a substrate due to melting and expansion of the solder material. When solder flash occurs, an unignorable problem as below may arise. Namely, significant influence on reliability of a product is concerned: for example, when solder progresses to connect electrodes of two components, short-circuiting between the electrodes occurs; and when solder in a joint portion connecting an electrode included in a component and an electrode for mount included in a substrate to each other flows and is lost, open-failure occurs.

Preferably, the solder ball contains at least one of Cu and Ag in a range not higher than 1.0 mass %.

When a small amount (1.0 mass % or less) of at least one of Cu and Ag is contained, mechanical strength of a solder joint portion after soldering with a solder bump can be improved.

The solder bump according to the present invention is formed with the method of forming a solder bump according to the present invention.

The solder bump according to the present invention preferably internally has at least one of a simple substance of Sn and an SnBi eutectic alloy layer.

When at least one of the simple substance of Sn and the SnBi eutectic alloy layer is internally locally present, a solder bump more reliably achieving the effect of the present invention described above can be obtained.

According to the method of forming a solder bump in the present invention, a solder bump is formed on an electrode containing Ni with the use of a solder ball containing Bi as a main component and containing Sn as a sub component. Therefore, shape accuracy is high, a surface is smooth and glossy, appearance inspection (inspection of a state of formation) can be conducted with such an optical method as a method with the use of an image sensor, and highly reliable soldering can be carried out.

A solder bump according to the present invention is formed with the method of forming a solder bump according to the present invention. Therefore, the solder bump has high shape accuracy and a smooth and glossy surface and can be subjected to appearance inspection such as inspection of a state of formation with such an optical method as a method with the use of an image sensor, and highly reliable soldering can be achieved when soldering with the solder bump is carried out.

BRIEF DESCRIPTION OF THE DRAWINGS

FIG. 3 is a diagram showing a state that a solder ball is placed on an electrode of an IC chip (a state before reflow) for forming a solder bump in the embodiment of the present invention.

DETAILED DESCRIPTION OF THE PREFERRED EMBODIMENTS

Figure 1:
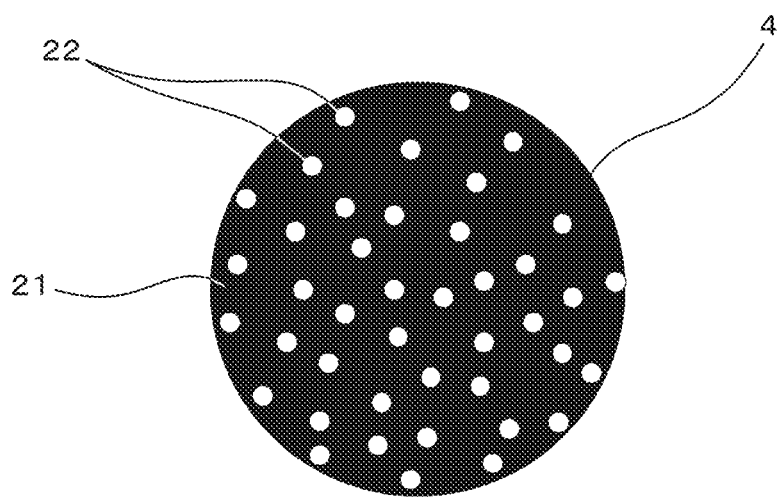
FIG. 1 is a diagram schematically showing a construction of a solder ball employed in an embodiment of the present invention.

A feature of the present invention will be described in further detail with reference to forms below for carrying out the present invention.

Overview of Embodiment

In a method of forming a solder bump according to the present invention, a solder bump is formed on an electrode containing Ni with the use of solder containing Bi as a main component and containing Sn as a sub component.

Specifically, a solder bump is formed on an electrode containing Ni, for example, by supplying a solder ball, which is obtained by once melting each metal material (Bi and Sn) forming solder and forming the metal material into a substantially spherical shape, onto the electrode containing Ni and melting the solder ball by heating the solder ball to a temperature (for example, 300° C.) exceeding a melting point (271° C.) of Bi. The solder bump formed with this method has high shape accuracy and a smooth and glossy surface, and can more efficiently and reliably be subjected to appearance inspection such as an inspection of a state of formation with such an optical method as a method with the use of an image sensor.

Since the solder bump formed with the method according to the present invention has shape accuracy and a smooth surface, highly reliable soldering can be carried out when the solder bump is used for soldering.

Here, an "electrode containing Ni" refers to Ni being a main component. For example, an Ni coating composed of Ni representing a main component and P introduced through electroless plating is also included. An amount of a contained component other than Ni, however, is preferably as small as possible, and particularly, preferably, the amount is not higher than 10 mass %.

An electrode containing Ni is not limited to an electrode composed of Ni, and it is a broad concept encompassing an electrode having a metal plated film or an organic film for improving wettability formed on a surface of an electrode layer composed of Ni and subjected to such surface treatment as rustproof treatment and an electrode obtained by forming an Ni-plated film on the electrode composed of Cu.

Specifically, examples include an Ni—Au electrode having an Au-plated film formed on a surface of an Ni electrode layer, an Ni—Pd—Au electrode having a plated film formed on a surface of an Ni electrode layer in the order of a Pd-plated film and an Au-plated film, an Ni rustproof (organic film) electrode in which a surface of an Ni electrode layer has been subjected to rustproof treatment, a Cu—Ni—Au electrode in which an Ni-plated film is formed on a surface of a Cu electrode layer and an Au-plated film is further formed thereon.

In a temperature range in which Bi is substantially molten, an Au layer or a rustproof layer is diffused into Bi. Therefore, even though an Au layer or a rustproof layer is formed on a surface of the Ni electrode layer before a reflow process, Ni and Bi react with each other to form a needle-shaped crystal on the surface. Therefore, an Ni electrode having an Au layer or a rustproof layer formed on the surface can also be concluded as an electrode to which application of the present invention is useful in forming a solder bump which is free from precipitation of a needle-shaped crystal on the surface and has a smooth and glossy surface.

It has been confirmed that a needle-shaped crystal of $NiBi_3$ is precipitated on a surface in a case of formation of a Bi-based solder bump on an Ni—Au-plated film (electrode) representing one of manners to which application of the present invention is most useful.

In the method of forming a solder bump according to the present invention, by adding Sn to a solder ball mainly composed of Bi as described above, no needle-shaped crystal which is a reaction product of Bi and Ni is generated at the time of formation of a solder bump on an electrode containing Ni, and a solder bump having a smooth and glossy surface and high shape accuracy is formed. Therefore, more reliable inspection can be conducted in inspection of a state of formation (appearance inspection) with the use of an image sensor.

When soldering is carried out with the use of a solder bump according to the present invention which has a smooth formed surface and high shape accuracy, highly reliable soldering can be carried out.

For example, when such an electronic component as an IC chip in which a solder bump is formed on an electrode containing Ni is mounted on a mount substrate such as a printed circuit board with the method according to the present invention, defective mount resulting from mount of an electronic component including a solder bump which should essentially be removed in inspection onto a mount substrate (an electronic component which has not been removed due to erroneous recognition during inspection in spite of the fact that a solder bump defective in shape was formed and should have been removed as a defective product) can be prevented and mountability can be improved.

Embodiment

In this embodiment, a case that a solder bump is formed on an electrode containing Ni by placing a solder ball on an Ni-containing electrode of an IC chip and melting the solder ball through heating will be described by way of example.

<Fabrication of Solder Ball>

(1) In fabricating a solder ball, initially, a solder ball used for forming a solder bump on an electrode containing Ni is fabricated.

Composition of a solder ball was basically defined as Bi-xSn-0.15 Cu. Then, a value for x was varied in a range from 0.0 to 20.0 mass %. A ratio (mass %) of Bi is calculated as a value obtained by subtracting a value for x for Sn (a value expressed with mass %) and a value for Cu expressed in mass % (0.15) from 100.

A specific ratio of Bi, Sn, and Cu of each sample (samples 1 to 15) is as shown in Table 1.

In sample 6, no Cu was blended but Ag was blended at a ratio of 1.0 mass %, and in sample 7, no Cu was blended but Ag was blended at a ratio of 0.1 mass %. In samples 8 and 9, both of Cu and Ag were blended at a ratio shown in Table 1. In sample 10, both of Cu and Co were blended at a ratio shown in Table 1. In sample 11, no Cu was blended but Co was blended at a ratio shown in Table 1. Sample 12 is a sample not satisfying the requirements of the present invention, without Sn being blended.

(2) Then, a solder ball was fabricated by heating and melting a solder material for forming a solder ball containing Bi, Sn, and Cu at a ratio in Table 1 and forming the solder material in a substantially spherical shape.

Figure 2:
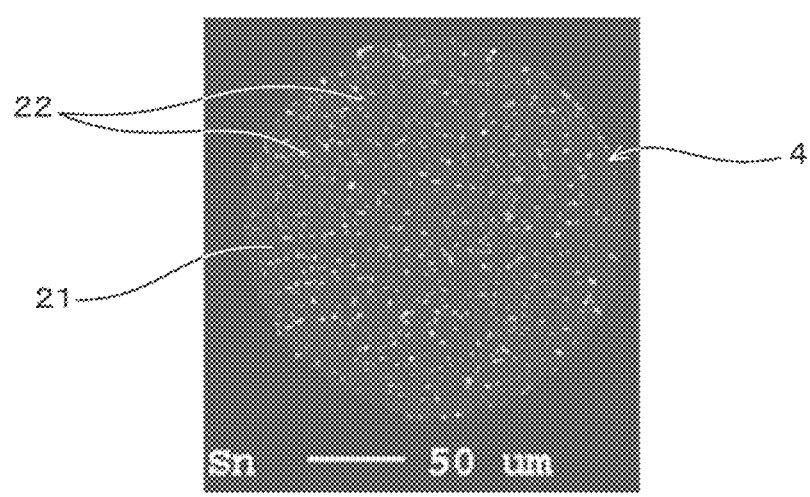
FIG. 2 shows a micrograph showing an internal structure of the solder ball employed in the embodiment of the present invention.

A solder ball 4 thus fabricated has a structure in which Sn 22 is dispersed in Bi 21 representing a base material of which schematic construction is shown in FIG. 1 and of which micrograph is shown in FIG. 2.

<Formation of Solder Bump>

A method of forming a solder bump will now be described.

(1) In forming a solder bump, as shown in FIG. 3, a flux 3 is applied to an electrode (an electrode containing Ni) 2 included in an IC chip 1, that is, electrode 2 having such a structure that an Ni layer (plated layer) 2b having a thickness from 1 to 10 μm is formed on a Cu layer 2a having a thickness from 1 to 20 μm and an Au layer (plated layer) 2c having a thickness from 0.01 to 0.5 μm is further formed thereon, and solder ball 4 is placed on electrode 2 with the use of a mounter.

(2) Then, a reflow process is performed at 300° C., and the entire solder ball 4, that is, the entirety including an internal metal (a BiSn eutectic alloy and Sn), is molten.

Figure 4A:
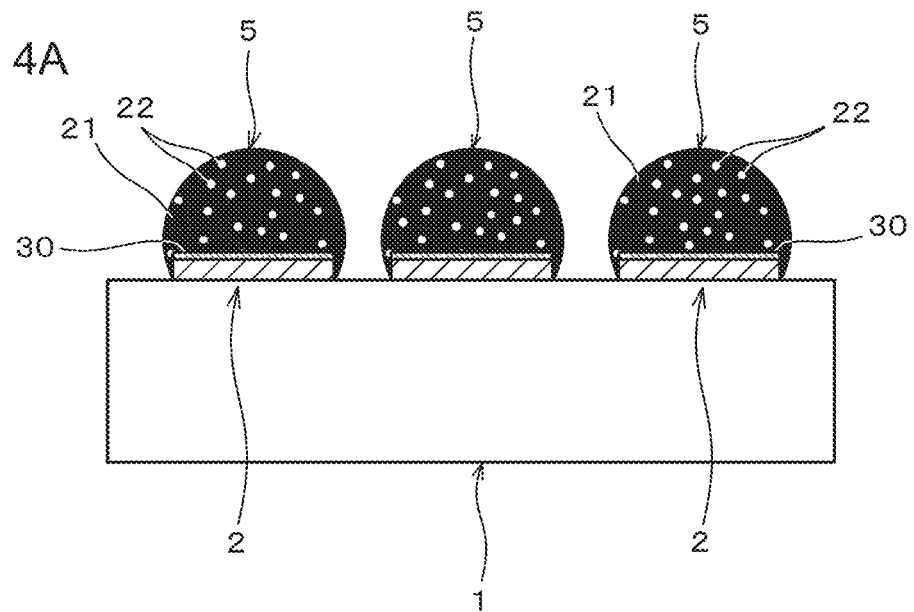
FIG. 4A is a diagram showing a construction of the solder bump formed in the embodiment of the present invention.
Figure 4B:
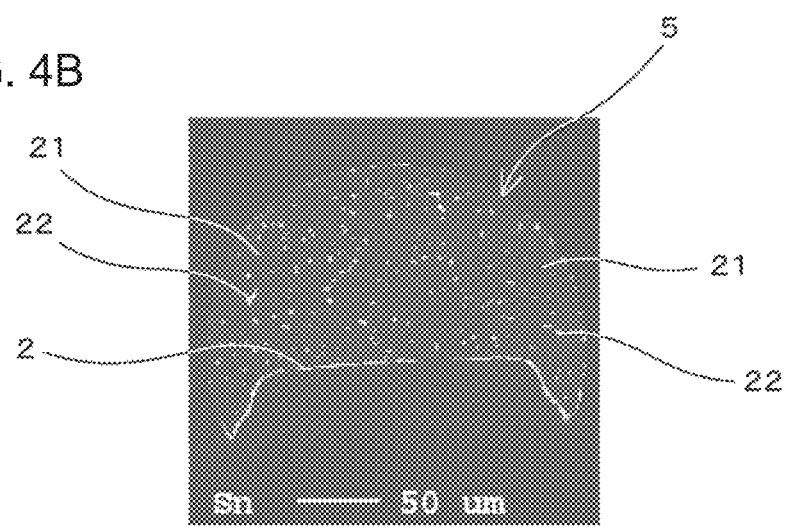
FIG. 4B shows a micrograph showing the construction of the solder bump formed in the embodiment of the present invention.

(3) Then, flux 3 (FIG. 3) is cleaned away, to thereby obtain a solder bump 5 as shown in FIG. 4A. This solder bump 5 is formed to cover electrode 2 included in IC chip 1, and an NiSn compound layer 30 which is an intermetallic compound layer high in melting point is formed at an interface with electrode 2 (in a case of a sample in which solder bump 5 does not contain Sn (sample 12 in Table 1), no NiSn compound layer 30 is formed). FIG. 4B shows a micrograph showing a state of distribution of Sn 22 in Bi 21 within solder bump 5.

Then, a state of formation of solder bump 5 (a state of mount) was checked with an image sensor.

<Mount of IC Chip>

Then, a method of forming a structure in which IC chip 1 was mounted on an electrode for mount 12 of a printed circuit board (glass epoxy substrate) 11 with solder bump 5 being interposed, by mounting and implementing the IC chip having the solder bump formed on the printed circuit board will be described.

Figure 5:
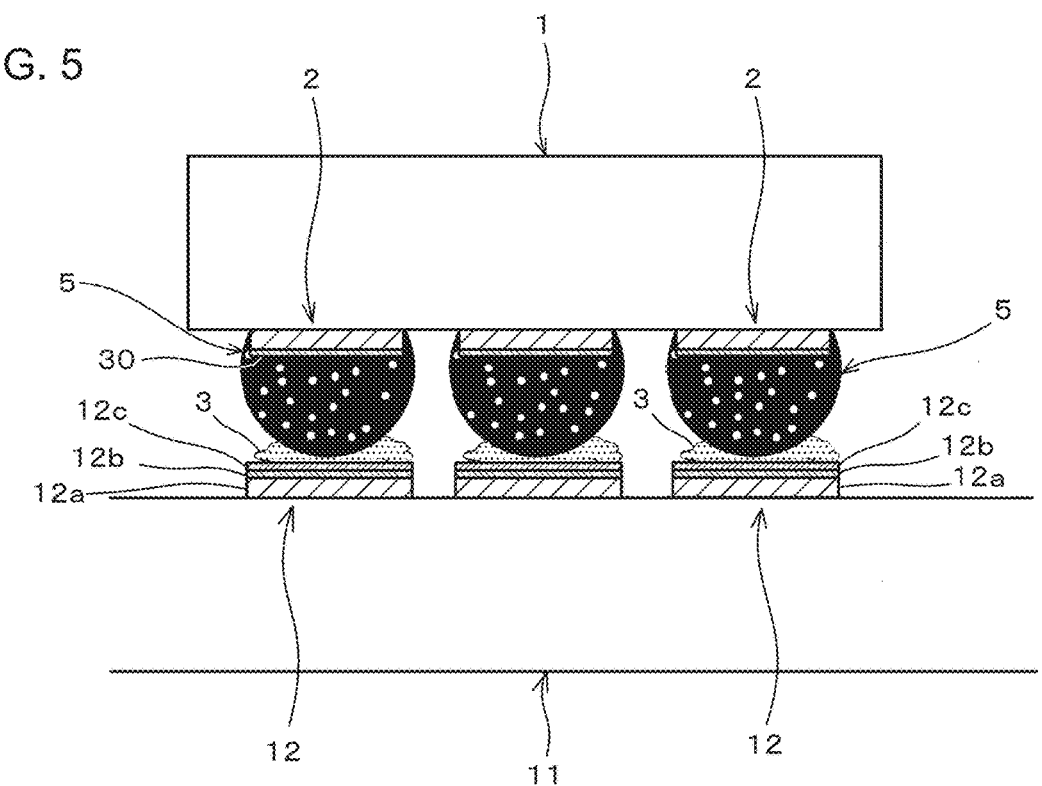
FIG. 5 is a diagram showing a state that an IC chip having the solder bump formed in the embodiment of the present invention is mounted on a printed circuit board.

(1) In mounting an IC chip, as shown in FIG. 5, IC chip 1 in such a state that solder bump 5 has been joined to electrode 2 is placed with the use of a mounter in such a position that solder bump 5 is opposed to electrode for mount 12 of printed circuit board 11, by applying flux 3 to electrode for mount 12 of printed circuit board (glass epoxy substrate) 11, that is, in this embodiment, electrode for mount 12 having such a structure that an Ni layer (plated layer) 12b having a thickness from 1 to 10 μm is formed on a Cu layer 12a having a thickness from 1 to 20 μm and an Au layer (plated layer) 12c having a thickness from 0.01 to 0.5 μm is further formed thereon.

(2) Thereafter, a reflow process (a second reflow process) at 300° C. is performed to thereby melt the entire solder bump 5.

Figure 6:
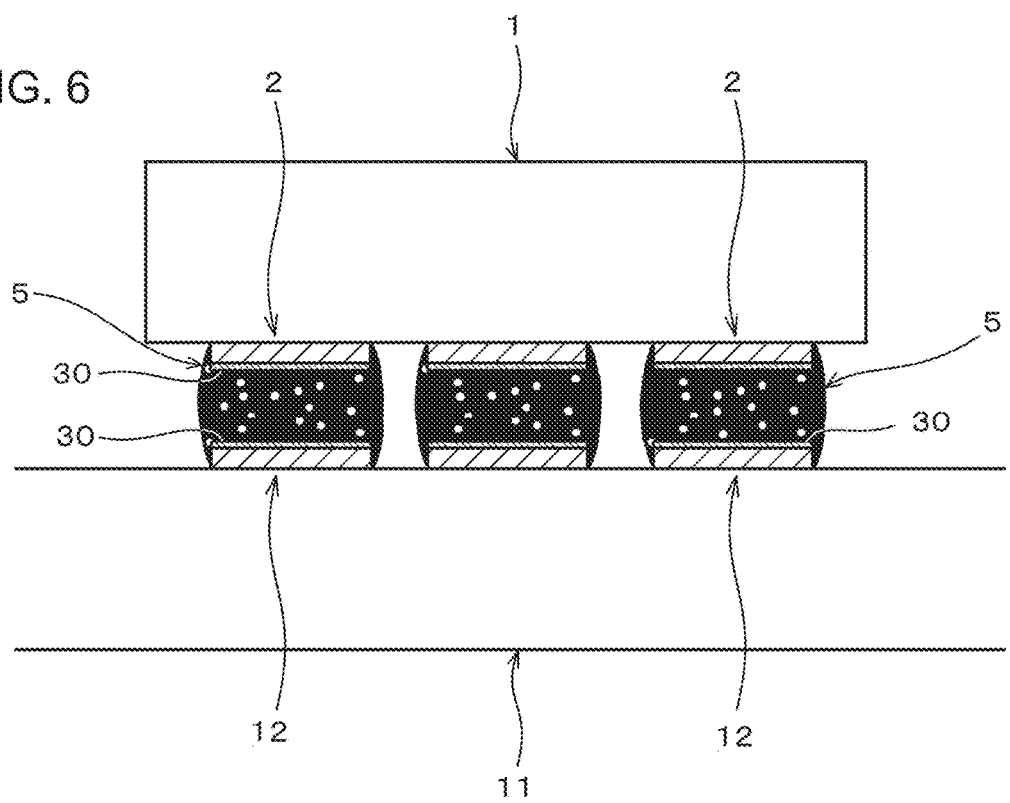
FIG. 6 is a diagram showing a state that the IC chip having the solder bump formed in the embodiment of the present invention is mounted on the printed circuit board, reflow is carried out, and thereafter a flux is removed.

(3) Thereafter, flux 3 is cleaned away from a joint portion. Thus, a structure in which IC chip 1 is mounted on electrode for mount 12 of printed circuit board (glass epoxy substrate) 11 with solder bump 5 being interposed as shown in FIG. 6 is obtained.

Though not particularly illustrated, in this embodiment, such resin sealing that a lower surface side of IC chip 1 was filled with an underfill resin and cured, for example, through heating under a condition of 180° C. and 60 minutes was carried out.

Thus, when solder bump 5 is formed on Ni-containing electrode 2 of IC chip 1 with the method according to the embodiment of the present invention with the use of Bi-based solder containing Sn, solder bump 5 which has high shape accuracy and a smooth and glossy surface and can be subjected to appearance inspection with such optical means as an image sensor can be formed.

In addition, by mounting IC chip 1 having solder bump 5 formed as described above on electrode for mount 12 of printed circuit board (glass epoxy substrate) 11 with the method according to the embodiment of the present invention with the use of Bi-based solder containing Sn, highly reliable mounting (BGA mounting) can be carried out.

Figure 7A:
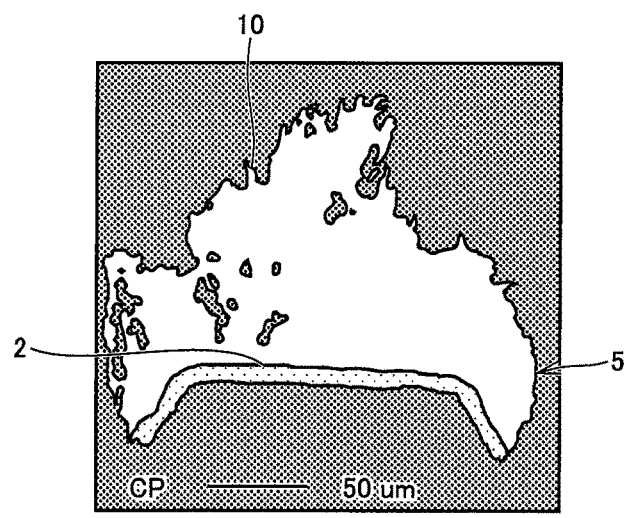
FIG. 7A is a photograph taken from a front side, of a solder bump formed with a Bi-based solder material to which no Sn has been added.
Figure 7B:
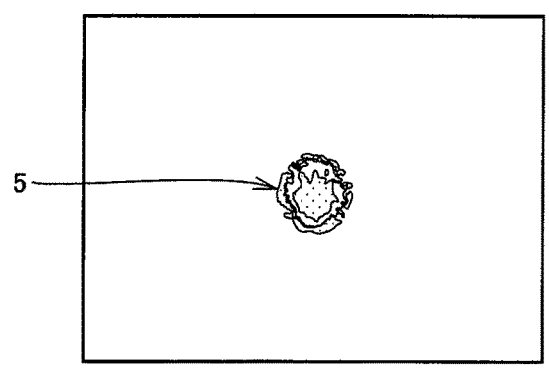
FIG. 7B is a photograph taken from an upper surface side.

When solder bump 5 is formed by placing a solder ball on electrode 2 of IC chip 1 and heating the solder ball as in the embodiment, whether or not a solder bump has normally been formed should be inspected with the use of an image sensor (appearance inspection). In the case of solder bump 5 formed of a Bi-based solder material to which no Sn has been added, however, as shown in FIG. 7A (a photograph taken from a front side), a needle-shaped crystal 10 resulting from reaction between Ni and Bi is formed on a surface of solder bump 5, and as shown in FIG. 7B (a photograph taken from an upper surface side), solder bump 5 is not glossy. Therefore, in the case of solder bump 5 formed of a Bi-based solder material to which no Sn has been added, it is difficult to determine whether or not a state of formation thereof (appearance) is good with such optical means as an image sensor.

Figure 8A:
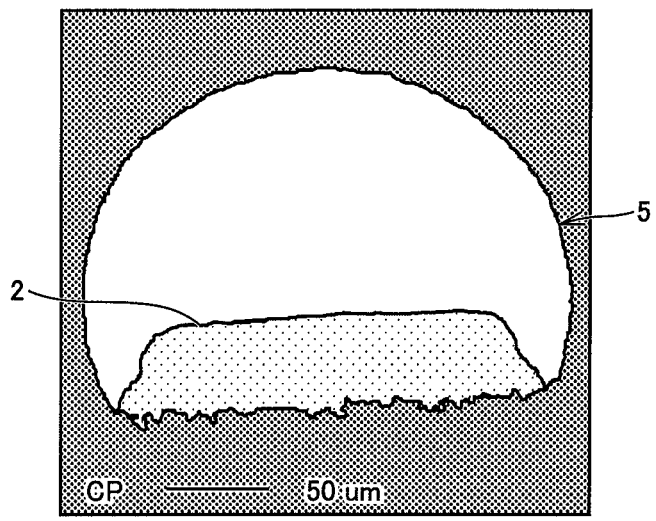
FIG. 8A is a photograph taken from a front side of a solder bump formed with a Bi-based solder material to which Sn has been added.
Figure 8B:
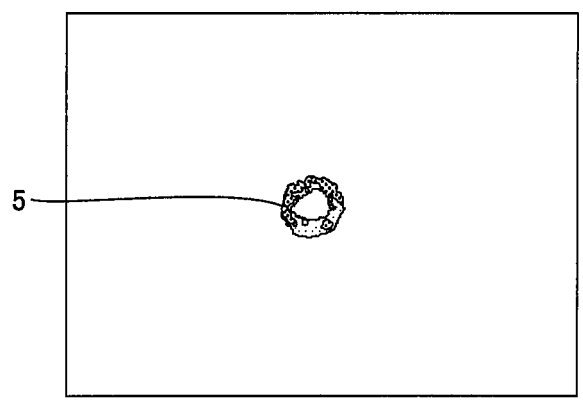
FIG. 8B is a photograph taken from an upper surface side.

In contrast, in solder bump 5 composed of a material to which Sn has been added, as is clear from FIG. 8A (a photograph taken from the front side), no needle-shaped crystal is generated on the surface of solder bump 5 and the surface is smooth, and as is clear from FIG. 8B (a photograph taken from the top surface side), solder bump 5 is glossy. Therefore, in the case of solder bump 5 formed of a Bi-based solder material to which Sn has been added, whether or not a state of formation thereof (appearance) is good can more readily and reliably be determined with such optical means as an image sensor.

In the case of solder bump 5 formed of a material to which no Sn has been added, even though appearance inspection could be conducted with such optical means as an image sensor, needle-shaped crystal 10 (FIG. 7A) formed on the surface thereof is high in melting point and is not molten at a melting temperature (271° C.) of Bi, and hence it has been confirmed that defective mounting is caused in mount on a mount substrate (printed circuit board).

Though Sn has to be contained as described above, in a case that an amount of addition of Sn is excessively large, when heating to a temperature (for example, around 250° C.) not lower than a melting point (232° C.) of Sn is carried out in a step of reflow soldering of Sn contained in solder bump 5, Sn or a BiSn eutectic alloy (a eutectic point of 139° C.) is molten, which causes solder flash.

In order to confirm this tendency, samples (samples 1 to 15) obtained by mounting samples each having solder bump 5 formed, with an amount of addition of Sn being varied within a range from 0.0 to 20.0 mass % as described above (IC chips including solder bumps 5 different in amount of addition of Sn), on electrodes for mount 12 of printed circuit boards (glass epoxy substrates) 11 and by sealing the lower surface side of IC chip 1 (around the solder joint portion) with an underfill resin were subjected to a reflow process at 300° C., and appearance inspection, occurrence of solder flash, a maximum length of a Bi—Ni intermetallic compound, and the number of solder bump joints in each sample were checked. Table 1 shows results.

TABLE 1

| | Composition of Bi-Based Solder Material | | | | Appearance Inspection ○: OK Δ: Not So Preferable x: NG | Occurrence of Solder Flash ○: OK Δ: Not So Preferable x: NG | Maximum Length of Bi—Ni Intermetallic Compound (μm) | The Number of Solder Bump Joints |
|---|---|---|---|---|---|---|---|---|
| Sample | Bi (Mass %) | Sn (Mass %) | Cu (Mass %) | Others (Mass %) | | | | |
| 1 | 98.85 | 1.0 | 0.15 | — | ○ | ○ | 10 | 10/10 |
| 2 | 97.85 | 2.0 | 0.15 | — | ○ | ○ | 0 | 10/10 |
| 3 | 94.85 | 5.0 | 0.15 | — | ○ | ○ | 0 | 10/10 |
| 4 | 89.85 | 10.0 | 0.15 | — | ○ | ○ | 0 | 10/10 |
| 5 | 98.00 | 2.0 | — | — | ○ | ○ | 0 | 10/10 |
| 6 | 96.00 | 3.0 | — | Ag: 1.0 | ○ | ○ | 0 | 10/10 |
| 7 | 97.90 | 2.0 | — | Ag: 0.1 | ○ | ○ | 0 | 10/10 |
| 8 | 96.90 | 2.0 | 0.10 | Ag: 1.0 | ○ | ○ | 0 | 10/10 |
| 9 | 97.80 | 2.0 | 0.10 | Ag: 0.1 | ○ | ○ | 0 | 10/10 |
| 10 | 97.85 | 2.0 | 0.10 | Co: 0.05 | ○ | ○ | 0 | 10/10 |
| 11 | 97.95 | 2.0 | — | Co: 0.05 | ○ | ○ | 0 | 10/10 |
| 12 | 99.85 | 0.0 | 0.15 | — | x | ○ | 120 | 1/10 |
| 13 | 99.35 | 0.5 | 0.15 | — | Δ | ○ | 100 | 3/10 |
| 14 | 84.85 | 15.0 | 0.15 | — | ○ | Δ | 0 | 10/10 |
| 15 | 79.85 | 20.0 | 0.15 | — | ○ | Δ | 0 | 10/10 |

The "maximum length of Bi—Ni intermetallic compound" in Table 1 represents a value measured with a method described below.

Initially, a cross-section of a solder bump portion used for appearance inspection was polished and observed at a magnification of 500 times with the use of a scanning electron microscope (SEM).

A Bi—Ni intermetallic compound layer and a Bi phase were identified with EDS of the SEM, and a maximum length of a continuous Bi—Ni intermetallic compound layer was measured.

Then, a maximum length of the continuous Bi—Ni intermetallic compound layer was measured for five bumps in each sample, and an average length obtained by dividing the values for the maximum length of the continuous Bi—Ni intermetallic compound layer in the bumps by the number of measurements 5 was defined as the "maximum length of Bi—Ni intermetallic compound."

The "number of solder bump joints" in Table 1 represents the number of solder bumps in which conduction was obtained by measuring a resistance value between the substrate and the IC of 10 bumps in each sample, as an indicator of a state of joint of a solder bump.

As shown in Table 1, it has been confirmed that, in a case of a sample in which an amount of addition of Sn exceeded 10 mass %, that is, sample 14 of which amount of addition of Sn was 15 mass % and sample 15 of which amount of addition of Sn was 20 mass %, a formed solder bump had a smooth and glossy surface and could be subjected to appearance inspection with the use of an image sensor, while solder flash disadvantageously occurred in some bumps. In the field of "occurrence of solder flash" in Table 1, "○: OK" means absence of occurrence of solder flash and "Δ: not so preferable" means occurrence of solder flash in some of bumps.

It has been confirmed that, in the case of sample 13 in which amount of addition of Sn was lower than 1.0 mass % (an amount of addition of Sn being 0.5 mass %), occurrence of solder flash was not observed but smoothness of the surface of the solder bump was not necessarily sufficient and gloss was less, and this sample was not suitable for appearance inspection with the use of an image sensor. In the field of "appearance inspection" in Table 1, "○: OK" means that appearance inspection with the use of an image sensor can be conducted and "Δ: not so preferable" means that the sample is not suitable for appearance inspection because there is a portion difficult to be subjected to appearance inspection.

It has been confirmed that, in the case of sample 12 to which no Sn was added (the sample not satisfying the requirements of the present invention), occurrence of solder flash was not observed, however, smoothness of the surface of the solder bump was insufficient and there was no gloss, and appearance inspection with the use of an image sensor could not be conducted.

In the embodiment above, a prescribed amount of Cu is contained in a Bi—Sn-based solder ball, and hence mechanical strength of a solder joint portion can further be improved. Mechanical strength of the solder joint portion can be improved also when Ag, Co, or both of Cu and Ag and/or Co is (are) contained in a prescribed range, without being limited Cu.

Therefore, a stronger solder bump can be formed by adding at least one of Cu, Ag, and Co so long as an effect owing to addition of Sn is not interfered (normally a range not higher than 1 mass %).

The present invention is not limited to the embodiment above, and types of an object in which a solder bump is to be formed by applying the present invention or a condition for forming a solder bump can be susceptible to various applications and modifications within the scope of the invention.

REFERENCE SIGNS LIST

1 IC chip; 2 electrode of IC chip;
2a Cu layer constituting electrode of IC chip;
2b Ni layer constituting electrode of IC chip;
2c Au layer constituting electrode of IC chip;
3 flux;
4 solder ball;
5 solder bump;
10 needle-shaped crystal;
11 printed circuit board;
12 electrode for mount of printed circuit board;
12a Cu layer constituting printed circuit board;
12b Ni layer constituting printed circuit board;
12c Au layer constituting printed circuit board;
21 Bi; 22 Sn; and
30 NiSn compound layer.

The invention claimed is:

1. A method of forming a solder bump on an electrode, the method comprising:
   forming a solder bump on an electrode containing Ni with a solder ball containing Bi as a main component and Sn as a sub component, wherein said solder ball contains the Bi in a range from 80.0 mass % or more.

2. The method of forming a solder bump according to claim 1, wherein said solder ball contains the Sn in a range from 1.0 to 10.0 mass %.

3. The method of forming a solder bump according to claim 2, wherein said solder ball further contains at least one of Cu and Ag in a range not higher than 1.0 mass %.

4. The method of forming a solder bump according to claim 1, wherein said solder ball further contains at least one of Cu and Ag in a range not higher than 1.0 mass %.

5. A method of forming a solder bump on an electrode, the method comprising:
   forming a solder bump on an electrode containing Ni with a solder ball containing Bi as a main component and Sn as a sub component, wherein said solder ball contains the Sn in a range from 1.0 to 10.0 mass %.

6. The method of forming a solder bump according to claim 5, wherein said solder ball further contains at least one of Cu and Ag in a range not higher than 1.0 mass %.

7. A method of forming a solder bump on an electrode, the method comprising:
   forming a solder bump on an electrode containing Ni with a solder ball containing Bi as a main component and Sn as a sub component, wherein said solder bump is formed by heating the solder ball to a temperature that exceeds a melting point of the Bi.

8. A solder bump formed on an electrode containing Ni with a solder ball containing Bi as a main component and Sn as a sub component, wherein said solder ball contains the Bi in a range from 80.0 mass % or more.

9. The solder bump according to claim 8, wherein said solder ball contains the Sn in a range from 1.0 to 10.0 mass %.

10. The solder bump according to claim 9, wherein said solder ball further contains at least one of Cu and Ag in a range not higher than 1.0 mass %.

11. The solder bump according to claim 8, wherein said solder ball further contains at least one of Cu and Ag in a range not higher than 1.0 mass %.

12. The solder bump according to claim 8, wherein the solder bump internally contains at least one of Sn and an SnBi eutectic alloy.

13. A solder bump formed on an electrode containing Ni with a solder ball containing Bi as a main component and Sn as a sub component, wherein said solder ball contains the Sn in a range from 1.0 to 10.0 mass %.

14. The solder bump according to claim 13, wherein said solder ball further contains at least one of Cu and Ag in a range not higher than 1.0 mass %.

15. The solder bump according to claim 13, wherein the solder bump internally contains at least one of Sn and an SnBi eutectic alloy.

16. A solder ball comprising:
   Bi as a main component in a range from 94.85 mass % or more;
   Sn as a sub component in a range from 1.0 to 10.0 mass %; and
   at least one of Cu and Ag in a range not higher than 1.0 mass %.

* * * * *